(12) United States Patent
Park et al.

(10) Patent No.: US 10,516,097 B2
(45) Date of Patent: Dec. 24, 2019

(54) MEMORY DEVICE

(71) Applicant: IUCF-HYU, Seoul (KR)

(72) Inventors: Jea Gun Park, Seongnam-si (KR); Du Yeong Lee, Seoul (KR); Seung Eun Lee, Seoul (KR); Min Su Jeon, Seongnam-si (KR); Jong Ung Baek, Seongnam-si (KR); Tae Hun Shim, Suwon-si (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 142 days.

(21) Appl. No.: 16/094,253

(22) PCT Filed: Mar. 18, 2015

(86) PCT No.: PCT/KR2015/002607
§ 371 (c)(1),
(2) Date: Oct. 17, 2018

(87) PCT Pub. No.: WO2015/160093
PCT Pub. Date: Oct. 22, 2015

(65) Prior Publication Data
US 2019/0172997 A1 Jun. 6, 2019

(30) Foreign Application Priority Data

Apr. 18, 2014 (KR) .................. 10-2014-0046563
Aug. 8, 2014 (KR) .................. 10-2014-0102419

(51) Int. Cl.
*H01L 43/02* (2006.01)
*H01L 43/08* (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC combination set(s) only.
See application file for complete search history.

(56) References Cited

U.S. PATENT DOCUMENTS

2007/0181880 A1* 8/2007 Kim .................. H01L 27/0688
257/67
2009/0073748 A1 3/2009 Klostermann
(Continued)

FOREIGN PATENT DOCUMENTS

| KR | 10-2006-0011732 A | 2/2006 |
| KR | 10-2011-0042657 A | 4/2011 |
| KR | 10-1040163 B1 | 6/2011 |

OTHER PUBLICATIONS

International Search Report for PCT/KR2015/002607 dated May 14, 2015.

*Primary Examiner* — Ratisha Mehta
(74) *Attorney, Agent, or Firm* — Sughrue Mion, PLLC

(57) ABSTRACT

The present invention provides a memory device in which lower electrodes, a buffer layer, a seed layer, a magnetic tunnel junction, a capping layer, synthetic exchange diamagnetic layers, and an upper electrode are formed on a substrate in a laminated manner. According to the present invention, the lower electrodes and the seed layer are formed of a polycrystalline conductive material, and the perpendicular magnetic anisotropy of the magnetic tunnel junction is maintained upon heat treatment at a high temperature of 400° C. or more.

14 Claims, 13 Drawing Sheets

(51) Int. Cl.
*H01L 43/10* (2006.01)
*G11C 11/16* (2006.01)
*H01F 10/32* (2006.01)
*H01F 41/32* (2006.01)
*H01L 27/22* (2006.01)
*H01L 43/12* (2006.01)

(52) U.S. Cl.
CPC ..... *H01F 10/3259* (2013.01); *H01F 10/3286* (2013.01); *H01F 41/32* (2013.01); *H01L 27/222* (2013.01); *H01L 43/08* (2013.01); *H01L 43/10* (2013.01); *H01L 43/12* (2013.01)

(56) References Cited

U.S. PATENT DOCUMENTS

2010/0288995 A1* 11/2010 Ozawa ................ H01L 45/1273
257/4
2013/0221460 A1 8/2013 Jan et al.

* cited by examiner

MEMORY DEVICE

CROSS-REFERENCE TO RELATED APPLICATIONS

This application is a National Stage of International Application No. PCT/KR2015/002607 filed Mar. 18, 2015 which claims the priority benefit of Korean Patent Application No. 10-2014-0046563, filed on Apr. 18, 2014, and Korean Patent Application No. 10-2014-0102419, filed on Aug. 8, 2014, in the Korean Intellectual Property Office, the disclosure of each of which is incorporated herein by reference.

TECHNICAL FIELD

The present invention relates to a memory device, and more particularly, to a magnetic memory device including a magnetic tunnel junction (MTJ).

BACKGROUND ART

Next-generation non-volatile memory devices with lower power consumption and higher degree of integration than flash memory devices are being studied. Such next-generation non-volatile memory devices include phase-change random access memory (PRAM) that uses state changes of a phase change material such as chalcogenide alloys, magnetic random access memory (MRAM) that uses resistance changes in a magnetic tunnel junction (MTJ) depending on the magnetization state of a ferromagnetic material, ferroelectric random access memory (FRAM) that uses polarization of a ferroelectric material, resistance-change random access memory (ReRAM) that uses resistance changes in a variable resistance material, and the like.

Examples of MRAM include a spin-transfer torque magnetic random access memory (STT-MRAM) device that inverts magnetization using a spin-transfer torque (STT) phenomenon generated by electron injection and discriminates a resistance difference before and after magnetization inversion. The STT-MRAM device includes a magnetic tunnel junction, which consists of a pinned layer and a free layer, each formed of a ferromagnetic material, and a tunnel barrier disposed therebetween. In the magnetic tunnel junction, when the magnetization directions of the free layer and the pinned layer are the same (that is, parallel), current flow is easy and consequently the magnetic tunnel junction is in a low resistance state. On the other hand, when the magnetization directions are different (that is, antiparallel), current is reduced and consequently the magnetic tunnel junction is in a high resistance state. In addition, in the magnetic tunnel junction, the magnetization directions must change only in the direction perpendicular to a substrate. Therefore, the free layer and the pinned layer must have perpendicular magnetization values. When the perpendicular magnetization values are symmetrical with respect to 0 according to the intensity and direction of a magnetic field, and a squareness (S) shape becomes clear (S=1), perpendicular magnetic anisotropy (PMA) is considered to be excellent. The STT-MRAM device is theoretically capable of cycling more than $10^{15}$ times and can be switched at a high speed of about a few nanoseconds (ns). In particular, a perpendicular magnetization type STT-MRAM device is advantageous in that there is no theoretical scaling limit, and as scaling progresses, the current density of driving current may be lowered. Therefore, the perpendicular magnetization type STT-MRAM device has been actively studied as a next-generation memory device that may replace DRAM devices. An example of the STT-MRAM device is disclosed in Korean Patent No. 10-1040163.

In the STT-MRAM device, a seed layer is formed on the lower part of the free layer, a capping layer is formed on the upper part of the pinned layer, and synthetic antiferromagnetic (SyAF) layers and an upper electrode are formed on the upper part of the capping layer. In addition, in the STT-MRAM device, a silicon oxide film is formed on a silicon substrate, and then the seed layer and a magnetic tunnel junction are formed thereon. In addition, a selection element such as a transistor may be formed on the silicon substrate, and the silicon oxide film may be formed so as to cover the selection element. Therefore, the STT-MRAM device has a laminated structure in which a silicon oxide film, a seed layer, a free layer, a tunnel barrier, a pinned layer, a capping layer, SyAF layers, and an upper electrode are formed on a silicon substrate on which a selection element is formed. In this case, the seed layer and the capping layer are formed using tantalum (Ta), and the SyAF layers have a structure in which a lower magnetic layer and an upper magnetic layer, in which a magnetic metal and a non-magnetic metal are alternately stacked, are formed, and a non-magnetic layer is formed therebetween.

However, since the seed layer formed on the upper part of the amorphous silicon oxide film is amorphous and the magnetic tunnel junction is also amorphous, the crystallinity of the magnetic tunnel junction may be deteriorated. That is, the pinned layer and the free layer are formed of amorphous CoFeB. In this case, the crystallinity of the magnetic tunnel junction is not greatly improved even when heat treatment is performed to improve perpendicular anisotropy characteristics. When the crystallinity of the magnetic tunnel junction is low, perpendicular magnetic anisotropy may be lowered. Therefore, even when a magnetic field is applied to change the magnetization direction, the magnetization direction does not change rapidly, and the amount of current flowing in a parallel state is reduced. As a result, read/write time is delayed, which makes it difficult to implement a high-speed memory device, and operation errors may occur during read/write operation.

In addition, a metal line forming process and a passivation process are performed after formation of the SyAF layers and the upper electrode. At this time, these processes are performed at a temperature of about 400° C. However, when Ta is used as the seed layer, the perpendicular magnetic anisotropy of the magnetic tunnel junction is lowered at a temperature of about 400° C. Therefore, it is necessary to improve the thermal stability of the perpendicular magnetic anisotropy of the magnetic tunnel junction.

DISCLOSURE

Technical Problem

Therefore, the present invention has been made in view of the above problems, and it is one object of the present invention to provide a memory device capable of rapidly changing the magnetization direction of a magnetic tunnel junction and thereby increasing read/write operation speed.

It is another object of the present invention to provide a memory device capable of improving the crystallinity of a magnetic tunnel junction and thereby rapidly changing the magnetization direction of the magnetic tunnel junction.

It is yet another object of the present invention to provide a memory device capable of improving the thermal stability of the perpendicular magnetic anisotropy of a magnetic tunnel junction.

Technical Solution

In accordance with one aspect of the present invention, provided is a memory device in which lower electrodes, a buffer layer, a seed layer, a magnetic tunnel junction, a capping layer, SyAF layers, and an upper electrode are formed on a substrate in a laminated manner, wherein the magnetic tunnel junction includes free layers consisting of first and second free layers and a separation layer, a tunneling barrier and a pinned layer, wherein the separation layer is formed between the first and second free layers and is formed of a polycrystalline conductive material.

The memory device may further include a lower barrier formed between the seed layer and the first free layer.

The lower barrier may be formed of a material identical to that of the tunneling barrier.

The separation layer may be formed of a material which crystallizes at a temperature of 400° C. or higher.

The separation layer may be formed of tungsten.

The separation layer may be formed to have a thickness of 0.4 nm to 0.8 nm.

The first and second free layers may be formed to have the same thicknesses or different thicknesses.

At least one of the lower electrodes, the seed layer, and the capping layer may be formed of a material which crystallizes at a temperature of 400° C. or higher.

At least one of the lower electrodes, the seed layer, and the capping layer may be formed of tungsten.

The magnetic tunnel junction may have a squareness of magnetization change of more than 0.8 and 1 or less after heat treatment at 400° C. or higher.

In accordance with another aspect of the present invention, provided is a memory device in which lower electrodes, a buffer layer, a seed layer, a magnetic tunnel junction, a capping layer, SyAF layers, and an upper electrode are formed on a substrate in a laminated manner, wherein the magnetic tunnel junction includes free layers consisting of first and second free layers and a separation layer, a tunneling barrier and a pinned layer, wherein the separation layer is formed between the first and second free layers; and at least one of the lower electrodes, the seed layer, the separation layer, and the capping layer is formed of a polycrystalline conductive material.

The polycrystalline conductive material may include a material which crystallizes at a temperature of 400° C. or higher.

The polycrystalline conductive material may include tungsten.

In accordance with yet another aspect of the present invention, provided is a method of fabricating a memory device, including a step of forming lower electrodes, a buffer layer, a seed layer, a magnetic tunnel junction, a capping layer, SyAF layers, and an upper electrode on a substrate in a laminated manner; and a step of performing heat treatment at 400° C. to 500° C., wherein, when the magnetic tunnel junction is formed, a first free layer, a separation layer, and a second free layer are formed and then a tunneling barrier and a pinned layer are formed, wherein the separation layer is formed of a polycrystalline conductive material; and the heat treatment is performed after the upper electrode is formed.

Advantageous Effects

In the memory device of the present invention, lower electrodes are formed of a polycrystalline material, a seed layer formed of a polycrystalline material is formed thereon, and a buffer layer is formed between the lower electrodes and the seed layer to improve compatibility between the lower electrodes and the seed layer. Since the lower electrodes and the seed layer are formed of a polycrystalline material, an amorphous magnetic tunnel junction formed on thereon is aligned with the crystal structure of the seed layer. In addition, by heat treatment after layer formation, an improved crystal structure can be obtained as compared with the conventional device. Therefore, the memory device can rapidly change the magnetization direction of the magnetic tunnel junction, thereby increasing read/write operation speed.

In addition, in the memory device of the present invention, the free layer can be formed to have a structure including a first free layer, a separation layer, and a second free layer so that the thickness of the free layer increases, thereby improving the thermal stability of the memory device. In addition, increase in the thickness of the free layer due to the presence of the separation layer can prevent horizontal magnetic anisotropy.

In addition, according to the present invention, since the seed layer and the separation layer are formed using a metal including tungsten, the magnetic tunnel junction can maintain perpendicular magnetic anisotropy even at a high temperature of 400° C. or more.

BEST MODE

Hereinafter, preferred embodiments of the present invention will be described in detail with reference to the accompanying drawings. However, the present invention may be embodied in many different forms and should not be construed as limited to the embodiments set forth herein. Rather, these embodiments are provided so that this disclosure will be thorough and complete, and will fully convey the scope of the disclosure to those skilled in the art.

Figure 1:
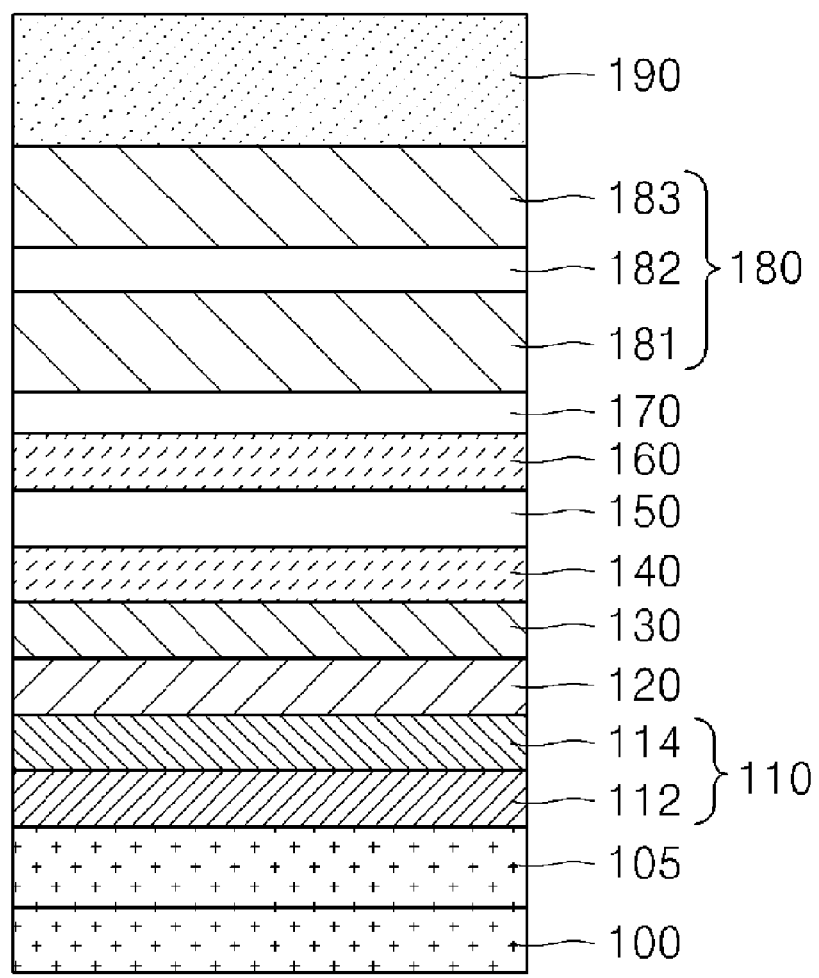
FIG. 1 is a cross-sectional view of a memory device according to one embodiment of the present invention.

FIG. 1 is a cross-sectional view of a memory device according to one embodiment of the present invention, that is, a cross-sectional view of an STT-MRAM device.

Referring to FIG. 1, a memory device according to one embodiment of the present invention includes lower electrodes 110, a buffer layer 120, a seed layer 130, a free layer 140, a tunneling barrier 150, a pinned layer 160, a capping layer 170, SyAF layers 180, and an upper electrode 190, which are formed on a substrate 100. In this case, the free layer 140, the tunneling barrier 150, and the pinned layer 160 form a magnetic tunnel junction.

The substrate 100 may be a semiconductor substrate. For example, as the substrate 100, a silicon substrate, a gallium arsenide substrate, a silicon germanium substrate, a silicon oxide film substrate, or the like may be used. In this embodiment, a silicon substrate is used. In addition, a selection element including a transistor may be formed on the substrate 100. An insulating layer 105 may be formed on the substrate 100. That is, the insulating layer 105 may be formed to cover predetermined structures such as a selection element and the like, and may be provided with a contact hole exposing at least a part of the selection element. The insulating layer 105 may be formed using a silicon oxide ($SiO_2$) film having an amorphous structure.

The lower electrodes 110 are formed on the insulating layer 105. The lower electrodes 110 may be formed using conductive materials, such as metals and metal nitrides. In addition, the lower electrodes 110 of the present invention may have a dual structure in which first and second lower electrodes 112 and 114 are formed. In this case, the first lower electrode 112 may be formed on the insulating layer 105, and the second lower electrode 114 may be formed on the first lower electrode 112. In addition, the first lower electrode 112 may be formed in the insulating layer 105, and may be connected to the selection element formed on the substrate 100. The first and second lower electrodes 112 and 114 may be formed of a polycrystalline material. That is, the first and second lower electrodes 112 and 114 may be formed of a conductive material having a bcc structure. For example, the first lower electrode 112 may be formed of a metal such as tungsten (W), and the second lower electrode 114 may be formed of a metal nitride film such as a titanium nitride (TiN) film.

The buffer layer 120 is formed on the upper part of the lower electrodes 110. That is, the buffer layer 120 is formed on the second lower electrode 114. The buffer layer 120 may be formed of a material having excellent compatibility with the second lower electrode 114 to eliminate lattice constant mismatch between the second lower electrode 114 and the seed layer 130. For example, when the second lower electrode 114 is formed of TiN, the buffer layer 120 may be formed using tantalum (Ta) having excellent lattice compatibility with TiN. In this case, Ta is amorphous, but the second lower electrode 114 is polycrystalline. Therefore, the amorphous buffer layer 120 may grow in the crystal direction of the polycrystalline second lower electrode 114, and then crystallinity may be improved by heat treatment. In addition, the buffer layer 120 may be formed to have a thickness of, for example, 2 nm to 10 nm.

The seed layer 130 is formed on the upper part of the buffer layer 120. The seed layer 130 may be formed of a polycrystalline material, for example, tungsten (W). When the seed layer 130 is formed of a polycrystalline material, the crystallinity of a magnetic tunnel junction including the free layer 140, the tunneling barrier 150, and the pinned layer 160 formed on the seed layer 130 may be improved. That is, when the polycrystalline seed layer 130 is formed, the amorphous magnetic tunnel junction formed on the seed layer 130 grows in the crystal direction of the seed layer 130. Then, when heat treatment is performed to impart perpendicular magnetic anisotropy, the crystallinity of the magnetic tunnel junction may be improved as compared with a conventional method. In particular, when W is used as the seed layer 130, crystallization occurs after heat treatment is performed at a high temperature of 400° C. or higher, for example, 400° C. to 500° C. Therefore, Ta diffusion into a tunnel barrier 150 is suppressed, and the free layer 140 and the pinned layer 160 may crystallize, thus maintaining the perpendicular magnetic anisotropy of the magnetic tunnel junction. That is, in the conventional method, since an amorphous seed layer and an amorphous magnetic tunnel junction are formed on an amorphous insulating layer, crystallinity is not improved even after heat treatment. However, according to the present invention, the crystallinity of a magnetic tunnel junction may be improved. In this case, when a magnetic field is applied, large magnetization may be generated, and the amount of current flowing through the magnetic tunnel junction in a parallel state may be increased. Therefore, when such a magnetic tunnel junction is applied to a memory device, the operating speed and reliability of the memory device may be improved. In addition, the seed layer 130 may be formed to have a thickness of, for example, 1 nm to 3 nm.

The free layer 140 is formed on the seed layer 130, and is formed of a ferromagnetic material. In the free layer 140, the direction of magnetization is not fixed to one direction, but may be switched from one direction to the opposite direction. That is, the magnetization direction of the free layer 140 may be the same (that is, parallel) as or opposite (that is, antiparallel) to the magnetization direction of the pinned layer 160. A magnetic tunnel junction may be utilized as a memory element by mapping information of '0' or '1' to a resistance value which changes depending on the magnetization arrangement of the free layer 140 and the pinned layer 160. For example, when the magnetization direction of the free layer 140 is parallel to that of the pinned layer 160, the resistance value of a magnetic tunnel junction becomes small. In this case, data may be defined as '0'. In addition, when the magnetization direction of the free layer 140 is antiparallel to that of the pinned layer 160, the resistance value of a magnetic tunnel junction becomes large. In this case, data may be defined as '1'. For example, the free layer 140 may be formed using an amorphous rare-earth element alloy, a multilayer thin film in which a magnetic metal and a non-magnetic metal are alternately stacked, an alloy having an L10 type crystal structure, or a ferromagnetic material such as a cobalt alloy. As the amorphous rare-earth element alloy, alloys such as TbFe, TbCo, TbFeCo, DyTbFeCo, and GdTbCo may be used. In addition, the multilayer thin film in which a magnetic metal and a non-magnetic metal are alternately stacked includes Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, the alloy having an L10 type crystal structure includes Fe50Pt50, Fe50Pd50, Co50Pt50, Fe30Ni20Pt50, Co30Ni20Pt50, and the like. In addition, the cobalt alloy includes CoCr, CoPt, CoCrPt, CoCrTa, CoCrPtTa, CoCrNb, CoFeB, and the like. Among these materials, the CoFeB single layer may be formed thicker than CoFeB and Co/Pt or Co/Pd of a multilayer structure, and thus the magnetoresistance ratio may be increased. In addition, since CoFeB is easier to etch than metals such as Pt and Pd, the CoFeB single layer is easier to fabricate than a multilayer structure containing Pt or Pd. Thus, according to an embodiment of the present invention, a CoFeB single layer is used to form the free layer 140, and the CoFeB is formed into an amorphous state and then textured into a BCC (100) by heat treatment.

The tunneling barrier 150 is formed on the free layer 140 and separates the free layer 140 and the pinned layer 160. The tunneling barrier 150 allows quantum mechanical tunneling between the free layer 140 and the pinned layer 160. The tunneling barrier 150 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In an embodiment of the present invention, polycrystalline magnesium oxide is used as the tunneling barrier 150. The magnesium oxide is textured into BCC (100) by heat treatment.

The pinned layer 160 is formed on the tunnel barrier 150. In the pinned layer 160, magnetization may be fixed to one direction in a magnetic field within a predetermined range, and may be formed of a ferromagnetic material. For example, the magnetization direction may be fixed to a direction extending from the upper part to the lower part. For example, the pinned layer 160 may be formed of an amorphous rare-earth element alloy, a multilayer thin film in which a magnetic metal and a non-magnetic metal are alternately stacked, or a ferromagnetic material such as an alloy having an L10 type crystal structure. In this case, the pinned layer 160 may be formed of the same ferromagnetic material as the free layer 140. Specifically, the pinned layer 160 may be formed of a CoFeB single layer. The CoFeB is formed into an amorphous state and then textured into BCC (100) by heat treatment.

The capping layer 170 is formed on the pinned layer 160 and magnetically separates the pinned layer 160 and the SyAF layers 180 from each other. The capping layer 170 is formed so that the magnetizations of the SyAF layers 180 and the pinned layer 160 are generated independently of each other. In addition, the capping layer 170 may be formed in consideration of the magnetoresistance ratio of the free layer 140 and the pinned layer 160 for operation of a magnetic tunnel junction. The capping layer 170 may be formed of a material allowing crystal growth of the SyAF layers 180. That is, the capping layer 170 allows first and second magnetic layers 181 and 183 of the SyAF layers 180 to grow in a desired crystal direction. For example, the capping layer 170 may be formed of a metal that facilitates crystal growth in the (111) direction of a face-centered cubic (FCC) lattice or the (001) direction of a hexagonal close-packed (HCP) structure. The material used to form the capping layer 170 may include tantalum (Ta), ruthenium (Ru), titanium (Ti), palladium (Pd), platinum (Pt), magnesium (Mg), cobalt (Co), aluminum (Al), and tungsten (W) and alloys thereof. Preferably, the capping layer 170 may be formed of at least one of tantalum (Ta) and tungsten (W). That is, the capping layer 170 may be formed of tantalum (Ta) or tungsten (W), and may be formed as a laminated structure of Ta/W. In addition, the capping layer 170 may be formed to have a thickness of 0.3 nm to 0.6 nm. When Ta is used, the capping layer 170 may be formed to have a thickness of 0.4 nm to 0.6 nm. When W is used, the capping layer 170 may be formed to have a thickness of 0.35 nm to 0.55 nm. In this case, the pinned layer 160 and the first magnetic layer 181 of the SyAF layers 180 must be ferro-coupled to fix the magnetization direction of the pinned layer 160. However, when the capping layer 170 having a thickness of 0.55 nm or more is formed using W, the magnetization direction of the pinned layer 160 is not fixed and has the same magnetization direction as the free layer 140 due to increase in the thickness of the capping layer 170. As a result, the same magnetization direction and other magnetization directions required in a MRAM device does not occur, and thus the MRAM device does not operate as a memory.

The SyAF layers 180 are formed on the capping layer 170. The SyAF layers 180 serve to fix the magnetization of the pinned layer 160. The SyAF layers 180 include the first magnetic layer 181, a non-magnetic layer 182, and a second magnetic layer 183. That is, in the SyAF layers 180, the first magnetic layer 181 and the second magnetic layer 183 are antiferromagnetically coupled via the non-magnetic layer 182. In this case, the magnetization directions of the first magnetic layer 181 and the second magnetic layer 183 are arranged antiparallel. For example, the first magnetic layer 181 may be magnetized in the upward direction (that is, the direction toward the upper electrode 190), and the second magnetic layer 183 may be magnetized in the downward direction (that is, the direction toward the magnetic tunnel junction). The first magnetic layer 181 and the second magnetic layer 183 may be formed by alternately stacking a magnetic metal and a non-magnetic metal. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu) or an alloy thereof may be used as the non-magnetic metal. For example, the first magnetic layer 181 and the second magnetic layer 183 may be formed of [Co/Pd]n, [Co/Pt]n, or [CoFe/Pt]n (wherein n is an integer of 1 or more). The non-magnetic layer 182 is formed between the first magnetic layer 181 and the second magnetic layer 183, and is formed of a nonmagnetic material that allows the first magnetic layer 181 and the second magnetic layer 183 to form diamagnetic coupling. For example, the non-magnetic layer 182 may be formed of a single metal selected from the group consisting of ruthenium (Ru), rhodium (Rh), osmium (Os), rhenium (Re), and chromium (Cr) or an alloy thereof.

The upper electrode 190 is formed on the SyAF layers 180. The upper electrode 190 may be formed using a conductive material such as metals, metal oxides, and metal nitrides. For example, the upper electrode 190 may be formed of a single metal selected from the group consisting of tantalum (Ta), ruthenium (Ru), titanium (Ti), palladium (Pd), platinum (Pt), magnesium (Mg), and aluminum (Al) or an alloy thereof.

As described above, in the memory device according to the embodiments of the present invention, the lower electrodes 110 are formed of a polycrystalline material, the seed layer 130 of a polycrystalline material is formed thereon, and the buffer layer 120 is formed between the lower electrodes 110 and the seed layer 130 to improve compatibility between the lower electrodes 110 and the seed layer 130. The lower electrodes 110 and the seed layer 130 are formed of a polycrystalline material, so that an amorphous magnetic tunnel junction formed thereon is aligned with the crystal structure of the seed layer 130. After the amorphous magnetic tunnel junction is formed, heat treatment is performed so that the amorphous magnetic tunnel junction has a better crystal structure than that of the conventional junction. That is, in the perpendicular magnetization-type magnetic tunnel junction, it is important to texture the (100) direction of the body-centered cubic (BCC) structures of the free layer, the tunneling barrier, and the pinned layer. In the present invention, the lower electrodes are formed of polycrystalline TiN, and a polycrystalline W seed layer is formed thereon, thereby securing an interface of a flat seed layer and improving the BCC (100) crystallinity of the magnetic tunnel junction. In addition, according to the present invention, since the seed layer 130 and the capping layer 170 are each made of a metal including tungsten, a magnetic tunnel junction is capable of maintaining perpendicular magnetic anisotropy even at a temperature of about 400° C. That is, after the upper electrode 190 is formed, metal line and passivation processes are performed at a temperature of about 400° C. At this time, in a conventional case using tantalum (Ta) as the seed layer, the perpendicular magnetic anisotropy of a magnetic tunnel junction is deteriorated at 400° C., but in the present invention, the perpendicular magnetic anisotropy of a magnetic tunnel junction may be maintained. The characteristics of the memory device according to one embodiment of the present invention and a conventional memory device are as follows.

Figure 2:
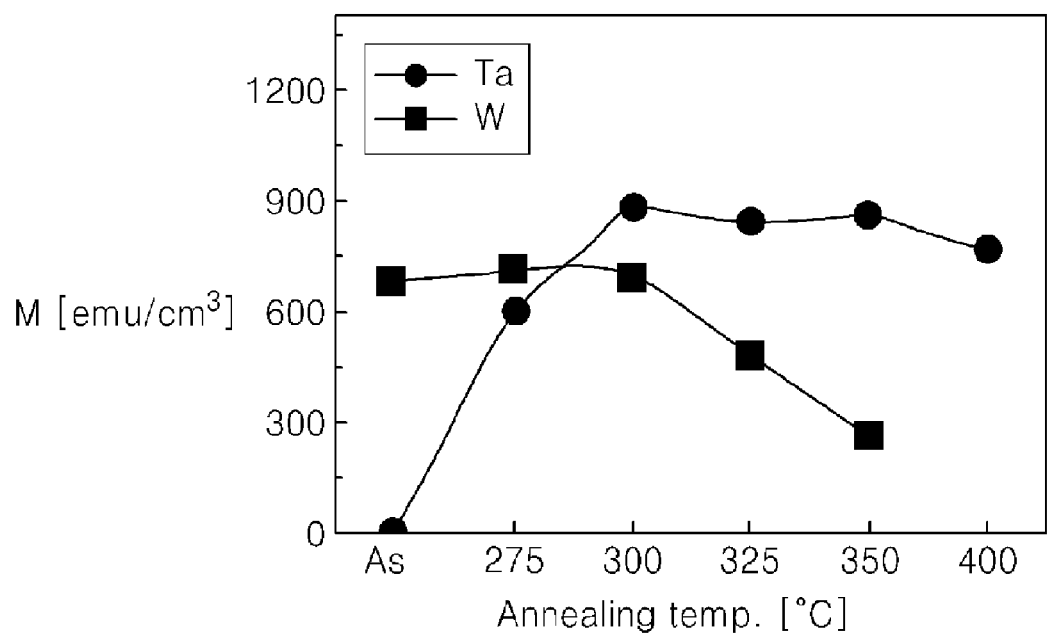
FIG. 2 is a graph showing heat treatment temperature-dependent magnetization of perpendicular magnetic anisotropy structures in which a seed layer is formed using Ta and W, respectively.

FIG. 2 is a graph showing heat treatment temperature-dependent magnetization of perpendicular magnetic anisotropy structures in which a seed layer is formed using Ta and W, respectively. First, a perpendicular magnetic anisotropy structure, in which a silicon oxide film, a Ta or W seed layer (5 nm), a CoFeB magnetic layer (1.05 nm), and a MgO tunneling barrier (2.0 nm) were laminated on a silicon substrate, was fabricated, and heat treatment was performed at various temperatures ranging from 275° C. and 400° C. As shown in FIG. 2, when a seed layer is formed using Ta, the magnetization value of a magnetic layer is kept constant from 275° C. to 300° C., but the magnetization value is lowered at 300° C. or higher. That is, when a magnetic layer is formed on a Ta seed layer, the perpendicular magnetic anisotropy of the magnetic layer is deteriorated at a high temperature of 300° C. or higher. However, when a seed layer is formed using W, the magnetization value is maintained at a temperature of 400° C. That is, when a magnetic layer is formed on a W seed layer, the magnetic layer is capable of maintaining perpendicular magnetic anisotropy at a high temperature of 400° C. or higher.

Figure 3:
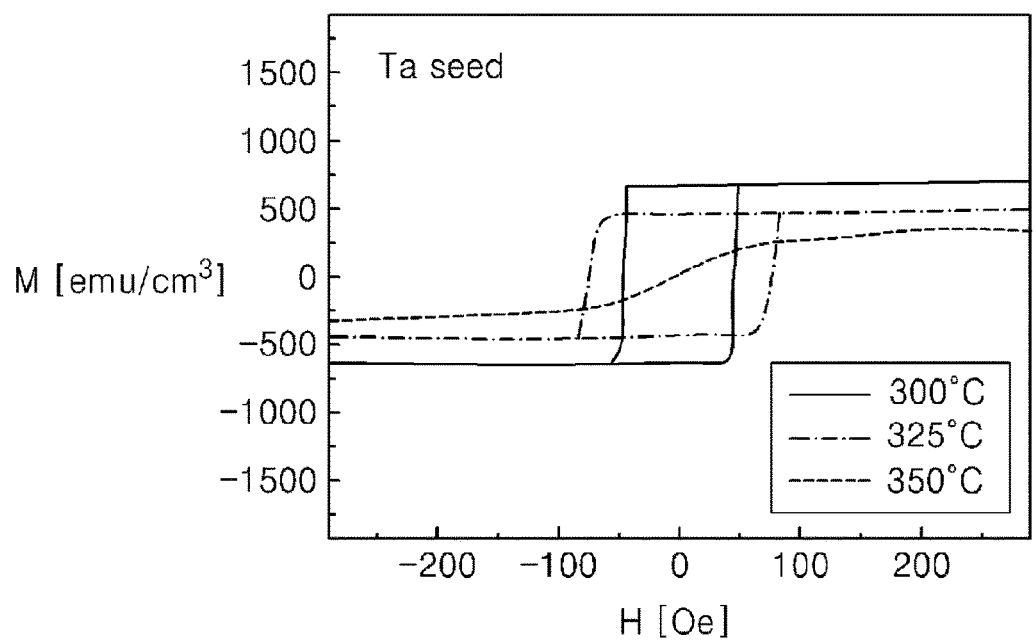
FIGS. 3 and 4 are graphs showing magnetic field-dependent magnetization of perpendicular magnetic anisotropy structures in which a seed layer is formed using Ta and W, respectively.
Figure 4:
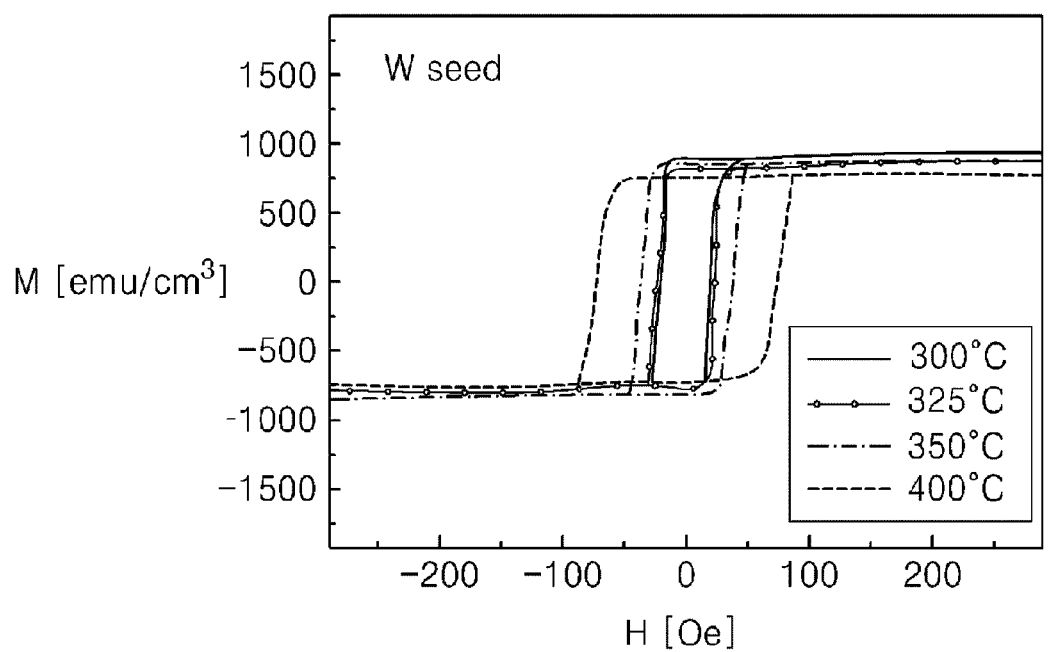

In addition, FIG. 3 is a graph showing magnetic field-dependent magnetization when Ta is used as a seed layer, and FIG. 4 is a graph showing magnetic field-dependent magnetization when W is used as a seed layer. As shown in FIG. 3, when Ta is used as a seed layer, perpendicular magnetic anisotropy is maintained up to 300° C., but perpendicular magnetic anisotropy is gradually decreased from 300° C. and completely vanishes at 350° C. or higher. On the other hand, as shown in FIG. 4, when W is used as a seed layer, perpendicular magnetic anisotropy is maintained even when temperature rises to 400° C.

Figure 5:
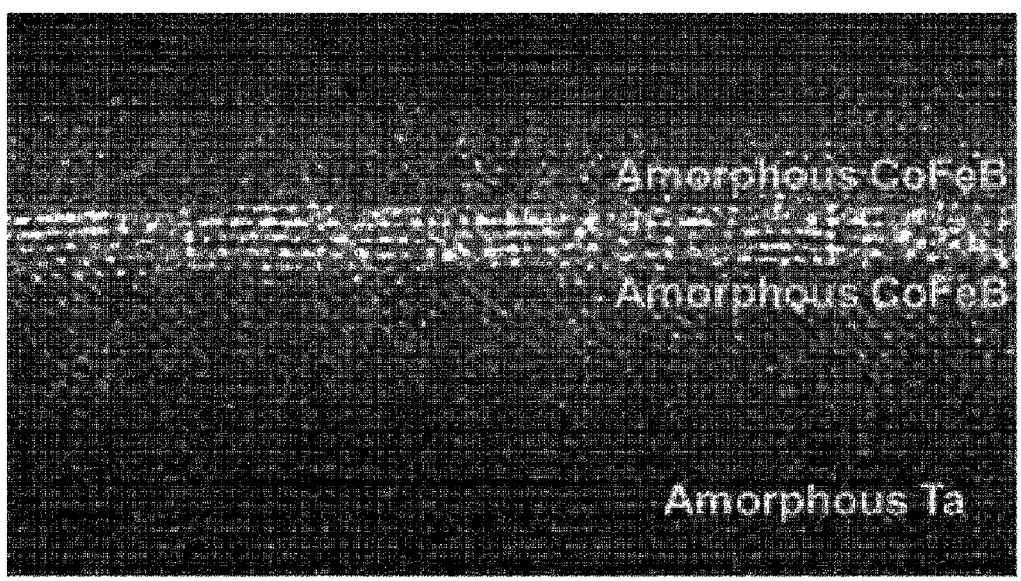
FIGS. 5 to 7 are TEM images showing the crystal states of a magnetic tunnel junction formed on a Ta seed layer according to a comparative example after the magnetic tunnel junction is heat-treated at various temperatures.
Figure 6:
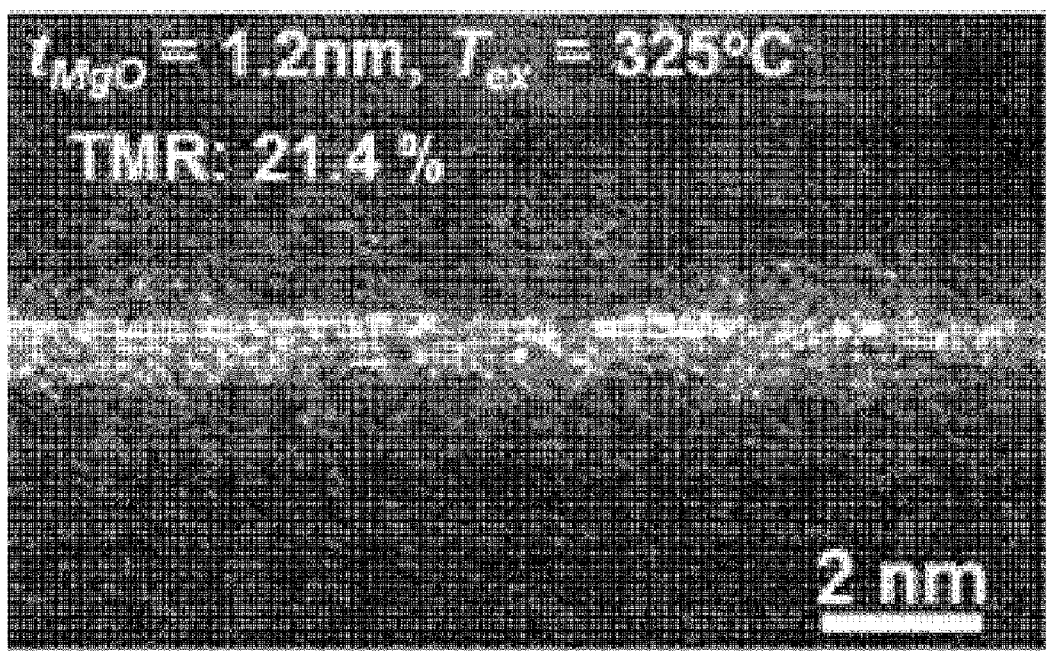
Figure 7:
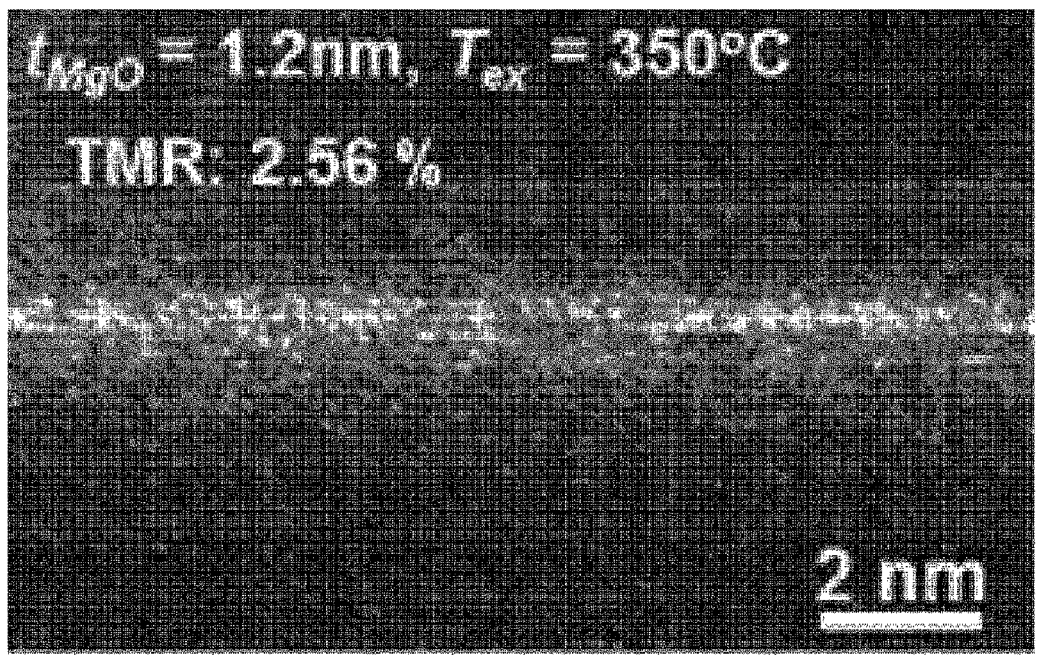

When a CoFeB magnetic layer, that is, a free layer and a CoFeB pinned layer, is formed on a Ta seed layer, the CoFeB magnetic layer is formed on the amorphous lattice structure of Ta. Therefore, as shown in FIG. 5, the amorphous state of the Ta seed layer and the CoFeB magnetic layer is maintained even when heat treatment is performed at a temperature of about 275° C. In addition, after heat treatment, a MgO tunnel barrier becomes an L10 crystal (bcc like) structure, boron (B) partially diffuses from the free layer and the CoFeB pinned layer to the MgO tunneling barrier and a Ta capping layer, and Co atoms and Fe atoms gather at the interface of MgO/CoFeB. Thereafter, CoFeB is maintained in an amorphous state, but at the interface of MgO/CoFeB, oxygen of MgO and Fe of CoFeB are combined to form Fe—O bonds. Fe—O bonding is an important mechanism for maintaining perpendicular properties because Fe—O bonding allows formation of interfacial perpendicular magnetic anisotropy (interfacial PMA). However, as shown in FIGS. 6 and 7, after heat treatment at 325° C. and 350° C., the Ta seed layer passes through the amorphous CoFeB and diffuses into the MgO tunnel barrier, thereby deteriorating the crystalline linearity of MgO. At this time, the atomic radius of Ta (135 pm) is almost equal to the atomic radius of Mg (137 pm), and therefore, MgTaOx is expected to be formed, which may deteriorate the crystallinity of the MgO tunnel barrier.

In addition, Ta is one of transition metals which are d-orbital elements and has a bcc lattice structure similar to the L10 lattice (bcc like) structure of the MgO tunnel barrier. In particular, a material having a bcc lattice structure among transition metals is preferably used as a seed layer used in a magnetic tunnel junction. Transition metals having a typical bcc lattice structure include V, Nb, Ta, Cr, Mo, W, Fe, and the like. However, since Fe and Cr have a too high or low crystallization temperature and have a high lattice mismatch with a TiN lower electrode, Fe and Cr may not be used as a seed layer for maintaining the perpendicular magnetic anisotropy of CoFeB. On the other hand, according to the present invention, a seed layer may be easily formed using W as in the case of using Ta. In particular, W crystallizes after heat treatment at a high temperature of 400° C., thereby suppressing Ta diffusion into the MgO tunnel barrier and further crystallizing the CoFeB magnetic layer to maintain the perpendicular magnetic anisotropy of the magnetic tunnel junction.

Figure 8:
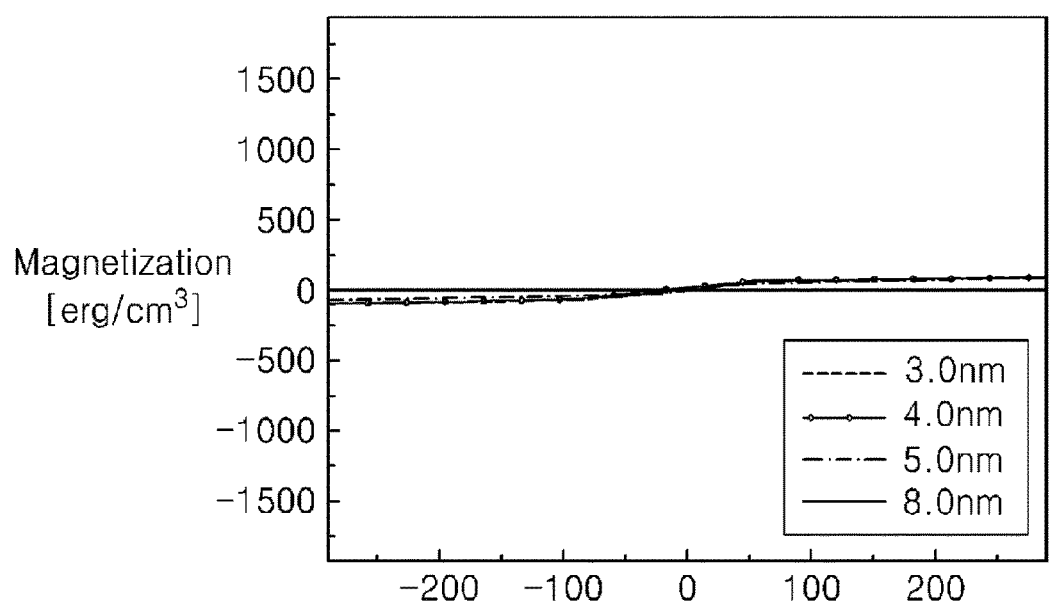
FIG. 8 is a graph showing heat treatment temperature-dependent magnetization of a perpendicular magnetic anisotropy structure in which a W seed layer is formed on a TiN lower electrode according to a comparative example.

FIG. 8 is a graph showing heat treatment temperature-dependent magnetization of a perpendicular magnetic anisotropy structure in which a tungsten seed layer is formed directly on a TiN lower electrode. That is, a first tungsten lower electrode and a second TiN lower electrode were formed on a silicon substrate, and a W seed layer, a CoFeB magnetic layer (1.05 nm), and a MgO tunneling barrier (2.0 nm) were laminated thereon, and magnetization characteristics depending on heat treatment temperatures were measured. In this case, the W seed layer was formed to have a thickness of 3 nm, 4 nm, 5 nm, or 8 nm. As shown in FIG. 8, when the W seed layer is formed directly on the TiN lower electrode, lattice mismatch between TiN and W becomes large and compatibility is reduced, which affect magnetic layer growth, so that perpendicular magnetic anisotropy is not generated.

Figure 9:
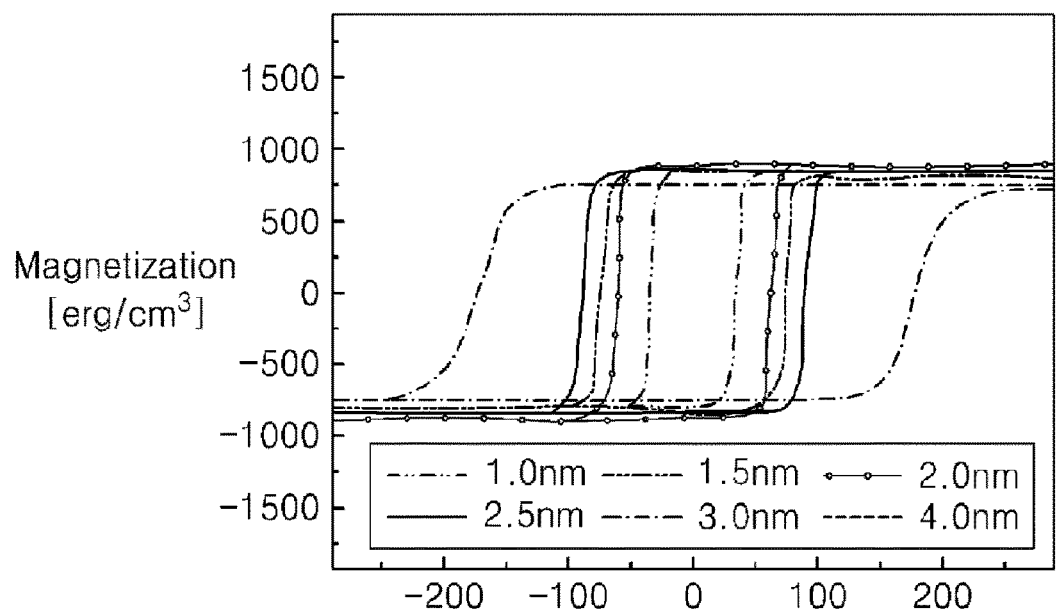
FIG. 9 is a graph showing heat treatment temperature-dependent magnetization of a perpendicular magnetic anisotropy structure in which a Ta buffer layer and a W seed layer are formed on a W/TiN lower electrode according to an embodiment of the present invention.

To solve these problems and form the W seed layer on the W/TiN lower electrode, the buffer layer is preferably formed using Ta having compatibility with TiN, and the W seed layer is formed thereon. FIG. 9 is a graph showing heat treatment temperature-dependent magnetization of a perpendicular magnetic anisotropy structure according to an embodiment of the present invention, in which a W/TiN lower electrode, a Ta buffer layer, a W seed layer, a CoFeB magnetic layer (1.05 nm), and a MgO tunneling barrier (2.0 nm) are laminated on a silicon substrate. In this case, the W seed layer was formed to have a thickness of 1 nm, 1.5 nm, 2 nm, 2.5 nm, 3 nm, or 4 nm, and heat-treated at a temperature of 400° C. As shown in FIG. 9, in the case of the present invention in which a Ta buffer layer and a W seed layer are formed on a W/TiN lower electrode, perpendicular magnetic anisotropy is evidently generated. That is, as shown in FIG. 9, when magnetization direction changes from one side to the other side, a rough square graph is formed due to coercive force. In this case, in the present invention, the squareness of the square is about 0.8 to 1. As squareness increases, the rate of magnetization change increases and the operating speed of a memory device may be increased. That is, according to the present invention, the read/write operation time of a memory device may be reduced.

Figure 10:
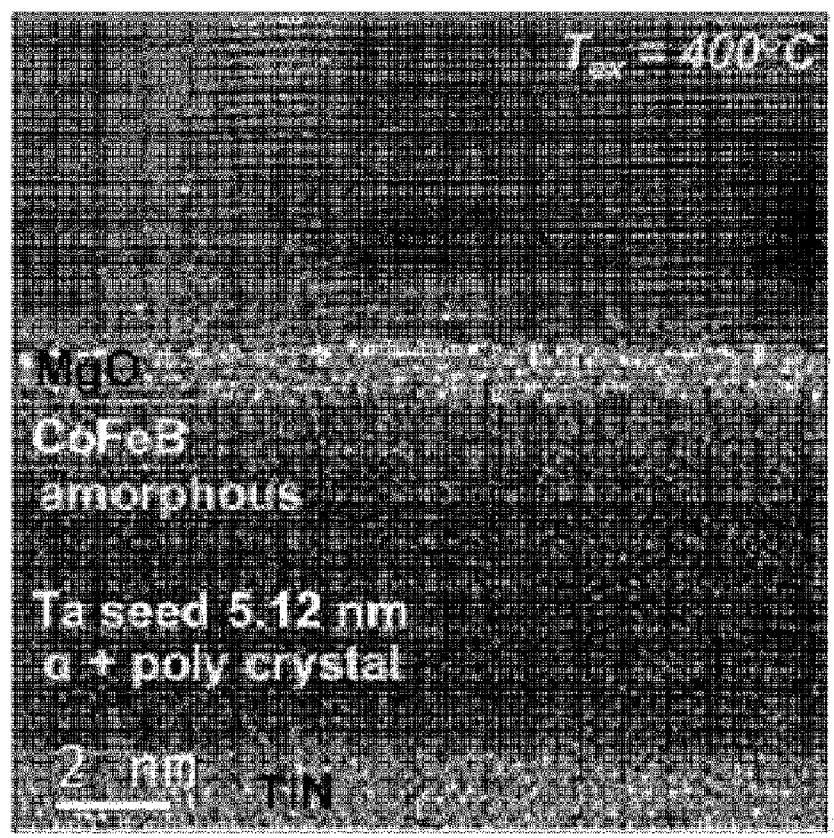
FIG. 10 is an image of a magnetic tunnel junction formed on a TiN lower electrode and a Ta seed layer according to a comparative example after heat treatment.
Figure 11:
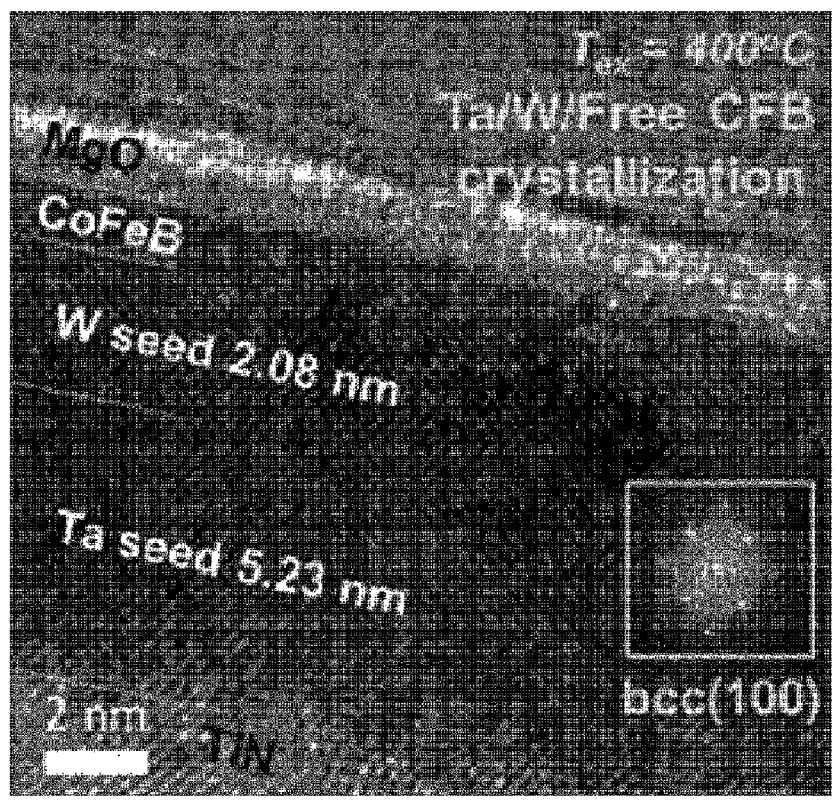
FIG. 11 is a TEM image of a magnetic tunnel junction formed on a TiN lower electrode, a Ta buffer layer, and a W seed layer according to an embodiment of the present invention after heat treatment.

In addition, FIG. 10 is a TEM image after heat treatment in the case wherein a Ta seed layer is formed on a TiN lower electrode, and FIG. 11 is a TEM image after heat treatment in the case wherein a Ta buffer layer and a W seed layer are formed on a TiN lower electrode. That is, FIG. 10 is a TEM image of a case wherein a Ta seed layer is formed on a TiN lower electrode, a CoFeB magnetic layer and a MgO tunnel barrier are formed, and heat treatment is performed at 400° C., and FIG. 11 is a TEM image of a case wherein a Ta buffer layer and a W seed layer are formed on a TiN lower electrode, a CoFeB magnetic layer and a MgO tunnel barrier are formed, and heat treatment is performed at 400° C. As shown in FIG. 10, when a Ta seed layer is formed, a CoFeB magnetic layer maintains an amorphous state. On the other hand, as shown in FIG. 11, a CoFeB magnetic layer formed on a Ta buffer layer and a W seed layer crystallizes upon heat treatment at a temperature of 400° C.

Figure 12:
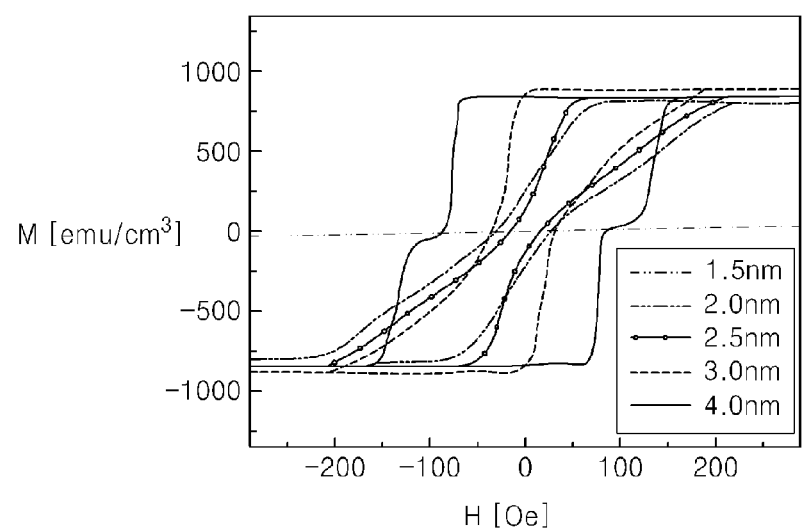
FIG. 12 is a graph showing magnetic field-dependent magnetization of a pseudo spin valve in which a W/TiN lower electrode, a Ta buffer layer, a W seed layer, and a W capping layer are formed according to an embodiment of the present invention.

In addition, to evaluate the perpendicular magnetic anisotropy of the free layer and the pinned layer of the perpendicular magnetic tunnel junction according to the present invention, a pseudo spin valve structure was fabricated, and magnetic field-dependent magnetization was measured. The obtained results are shown in FIG. 12. FIG. 12 is a graph showing magnetic field-dependent magnetization of the pseudo spin valve according to the present invention in which a silicon oxide film is formed on a silicon substrate, and a W/TiN lower electrode, a Ta buffer layer (5 nm), a W seed layer (2 nm), a CoFeB free layer (1.05 nm), a MgO tunnel barrier (1.2 nm), a CoFeB pinned layer (1.0 nm), and a W capping layer (1.5 to 4 nm) are laminated thereon. That is, to confirm perpendicular magnetic anisotropy according to the thickness of a W capping layer, the magnetic field-dependent magnetization of pseudo spin valves having different thicknesses of a capping layer was measured. In this case, as a capping layer formed on the CoFeB pinned layer, the W capping layer capable of maintaining the perpendicular magnetic anisotropy of the CoFeB pinned layer even after heat treatment at 400° C. was used instead of Ta used in a conventional device. As shown in FIG. 2, when the W capping layer has a thickness of 4 nm or more, the perpendicular magnetic anisotropy of the CoFeB magnetic layer is maintained. In addition, in an embodiment of the present invention, the W seed layer is formed to have a thickness of 0.35 nm to 0.55 nm, and in an experimental example, the W capping layer is formed to have a thickness of 4 nm or more. In the case of the pseudo spin valve structure according to the experimental example in which a W capping layer is formed to have a thickness of 4 nm or less, since no structure is formed on the capping layer, W is oxidized, which affects the CoFeB magnetic layer, and perpendicular magnetic anisotropy characteristics is deteriorated. Thus, the result was 4 nm or more. On the other hand, according to the embodiment, since SyAF layers are formed on the W capping layer, the capping layer is not oxidized. In this case, when the capping layer is formed to have a thickness of 0.35 nm to 0.55 nm, perpendicular magnetic anisotropy may be obtained.

In the conventional case using a Ta seed layer and a Ta capping layer, CoFeB grows as an amorphous solid, and when heat treatment is performed at 300° C. or more, a Ta element diffuses into the MgO layer and the crystallinity of MgO is destroyed. On the other hand, in the present invention using a W seed layer and a W capping layer, the W seed layer and the W capping layer become crystalline after heat treatment at 400° C. Therefore, W may suppress Ta diffusion into the MgO layer. In addition, by allowing crystallization of the CoFeB magnetic layer, a crystal-state perpendicular magnetic tunnel junction maintaining perpendicular magnetic anisotropy is formed.

In addition, in the conventional magnetic tunnel junction in which a Ta seed layer and a Ta capping layer are formed, the perpendicular magnetic anisotropy of a CoFeB magnetic layer was maintained upon heat treatment at a temperature of 275° C., and the tunnel magnetoresistance (TMR) ratio was about 130.86%. However, in the conventional magnetic tunnel junction in which a Ta seed layer and a Ta capping layer are formed, when heat treatment is performed at a temperature of 300° C. or more, the perpendicular magnetic anisotropy of the CoFeB magnetic layer disappears, and the TMR ratio is reduced. On the other hand, as shown in the present invention, in the magnetic tunnel junction in which a Ta buffer layer and a W seed layer are formed and then a Ta capping layer is formed, a tunneling barrier was formed. In addition, when heat treatment was performed at a temperature of 400° C., the TMR ratio was 136.45%, which was slightly higher than in the conventional case. However, in the case wherein the capping layer is formed using W, that is, in a magnetic tunnel junction in which a Ta buffer layer, a W seed layer, and a W capping layer are formed, the TMR ratio was maintained at 134.44% upon heat treatment at a temperature of 400° C. The thickness of the W capping layer for obtaining the TMR ratio is maintained at about 0.35 nm to 0.55 nm. Meanwhile, the TMR ratio was measured using a current-in-plane tunneling (CiPT) instrument. In the CiPT measuring method, two probes are bonded on a thin upper electrode, and the spacing between the two probes is measured and distinguished by a few micrometers. At this time, in the instrument, the TMR ratio is calculated by fitting the resistances between the thin upper electrode measured at intervals of several micrometers and the thick lower electrode.

In addition, STT-MRAM stores data and functions as a memory. The spin direction of a free layer may be unintentionally changed by ambient heat or other energy, which may cause the stored data to change. To solve such a problem, thermal stability ($\Delta$) expressed by Equation 1 must be increased.

$$\Delta = \frac{K_u V}{K_B T} \quad \text{Equation 1}$$

Figure 13:
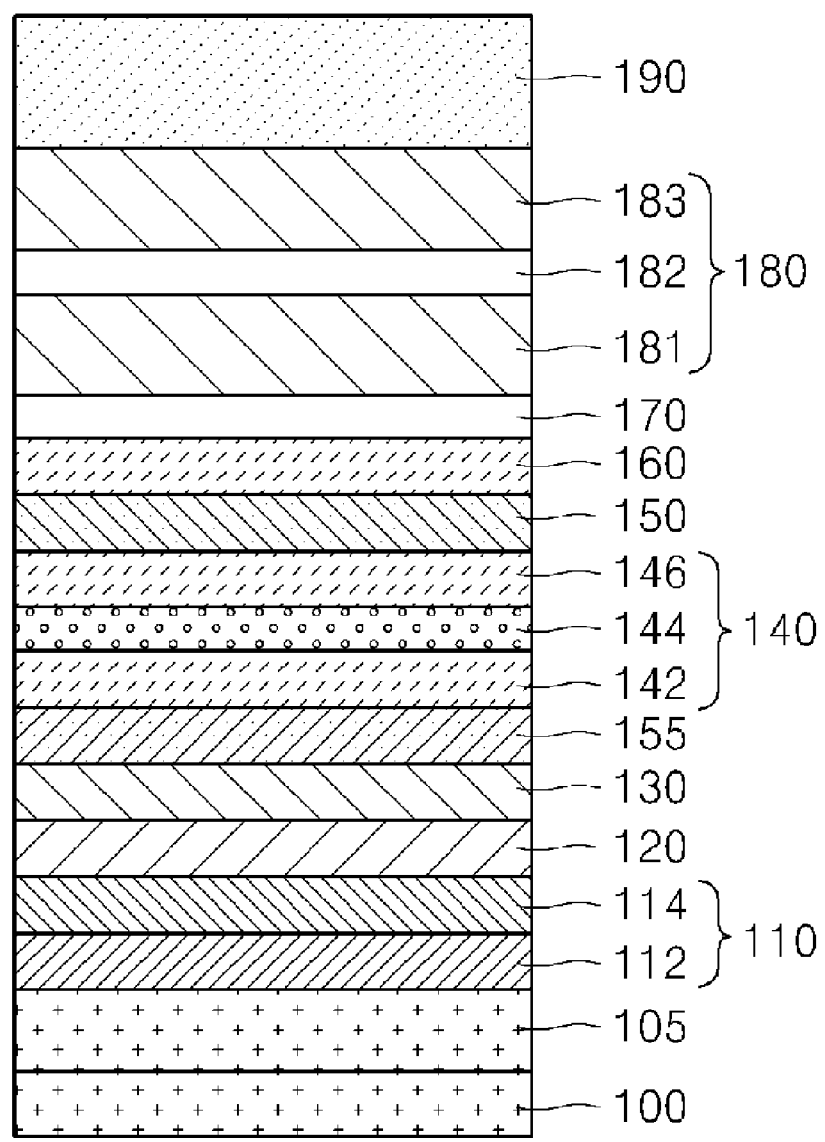
FIG. 13 is a cross-sectional view of a memory device according to another embodiment of the present invention.

In this case, the denominator is a constant that cannot be changed. Therefore, to increase $\Delta$, the numerator value must be increased. However, perpendicular magnetic anisotropy (Ku) is an eigenvalue of a material, and the Ku of the free layer is limited. Therefore, a method of increasing the volume (V) is required. In general, when interface perpendicular magnetic anisotropy (i-PMA) is expressed at the interface between a free layer and a tunneling barrier, that is, the CoFeB/MgO interface, the CoFeB exhibits perpendicular magnetic anisotropy (PMA) rather than horizontal magnetic anisotropy (IMA). However, when the thickness of the CoFeB is about 1.4 nm or more, horizontal magnetic anisotropy (IMA), an inherent characteristic, appears. Therefore, the thickness of the CoFeB is limited, and increase in volume is also limited. Therefore, as shown in FIG. 13, the free layer is thickened to increase the volume, and the thick free layer is separated so that perpendicular magnetic anisotropy is exhibited. Other embodiments of the present invention will now be described with reference to FIG. 13. In the following description, contents overlapping with those in FIG. 1 will be omitted.

Referring to FIG. 13, the memory device according to another embodiment of the present invention includes the lower electrodes 110, the buffer layer 120, the seed layer 130, a lower barrier 155, a first free layer 142, a separation layer 144, a second free layer 146, the tunneling barrier 150, the pinned layer 160, the capping layer 170, the SyAF layers 180, and the upper electrode 190, which are formed on the substrate 100. In this case, the first free layer 142, the separation layer 144, and the second free layer 146 form the free layers 140, and the free layers 140, the tunneling barrier 150, and the pinned layer 160 form a magnetic tunnel junction. That is, the thickness of the free layers 140 is increased to improve thermal stability. At the same time, to prevent generation of horizontal magnetic anisotropy due to increase in the thickness of the free layers 140, the separation layer 144 is formed, so that the free layers 140 have a dual structure including the first and second free layers 142 and 146. In addition, since the first free layer 142, for example, CoFeB, exhibits perpendicular magnetic anisotropy at the interface with MgO, the lower barrier 155 is formed below the first free layer 142.

The lower barrier 155 may be formed on the seed layer 130, and may be formed of magnesium oxide (MgO), aluminum oxide ($Al_2O_3$), silicon oxide ($SiO_2$), tantalum oxide ($Ta_2O_5$), silicon nitride (SiNx), or aluminum nitride (AlNx). In this case, the lower barrier 155 may be formed of a material identical to that of the tunneling barrier 150, or may be formed of a material different from that of the tunneling barrier 150. However, the lower barrier 155 is preferably formed of a material identical to that of the tunneling barrier 150, and may be formed of a polycrystalline magnesium oxide. The magnesium oxide is textured into BCC (100) by heat treatment. The lower barrier 155 allows the first free layer 142 to have perpendicular magnetic anisotropy.

The first and second free layers 142 and 146 are formed of a ferromagnetic material. In the first and second free layers 142 and 146, magnetization may not be fixed to one direction, but may be switched from one direction to the opposite direction. That is, the magnetization directions of the first and second free layers 142 and 146 may be the same (that is, parallel) as or opposite (that is, antiparallel) to the magnetization direction of the pinned layer 160. In addition, the magnetization directions of the first and second free layers 142 and 146 may be changed in the same direction and may be changed at the same time. For example, the first and second free layers 142 and 146 may be formed using an amorphous rare-earth element alloy, a multilayer thin film in which a magnetic metal and a non-magnetic metal are alternately stacked, an alloy having an L10 type crystal structure, or a ferromagnetic material such as a cobalt alloy. For example, the first and second free layers 142 and 146 may be formed as a CoFeB single layer. The CoFeB is formed into an amorphous state and then textured into BCC (100) by heat treatment. In addition, the first and second free layers 142 and 146 may each have a thickness of 0.8 nm to 1.4 nm, and may have different thicknesses or the same thickness. For example, the first free layer 142 may be formed to be thinner than the second free layer 146.

The separation layer 144 is provided between the first and second free layers 142 and 146 to separate the first and second free layers 142 and 146 from each other. That is, the separation layer 144 is formed between the first and second free layers 142 and 146 to prevent generation of horizontal magnetic anisotropy in the free layers 140 due to increase in the thickness of the free layers 140. The separation layer 144 may be formed of a polycrystalline material. That is, the separation layer 144 may be formed of a conductive material having a bcc structure. For example, the separation layer 144 may be formed using tungsten, and may be formed to have a thickness of 0.4 nm to 0.8 nm. That is, the separation layer 144 may be formed of tungsten as in the first lower electrode 112 and the capping layer 170. When the separation layer 144 is formed of tungsten, the separation layer 144 crystallizes after heat treatment at a high temperature of 400° C. or higher, for example, 400° C. to 500° C. As a result, the free layers 140 and the pinned layer 160 crystallize, so that the perpendicular magnetic anisotropy of a magnetic tunnel junction may be maintained.

As described above, in the memory device according to another embodiment of the present invention, the thickness of the free layers 140 is increased to improve thermal stability. At the same time, to prevent generation of horizontal magnetic anisotropy due to increase in the thickness of the free layers 140, the separation layer 144 is formed, so that the free layers 140 have a dual structure including the first and second free layers 142 and 146. In addition, the separation layer 144 is formed of tungsten, so that the separation layer 144 crystallizes after heat treatment at a high temperature of 400° C. or higher. As a result, the perpendicular magnetic anisotropy of a magnetic tunnel junction may be maintained.

The technical idea of the present invention has been particularly described through the aforementioned examples. However, it should be noted that the examples were provided for explanation and the present invention is not limited thereto. In addition, those skilled in the art will understand that various modifications are possible within the range of the technical idea of the present invention.

The invention claimed is:

1. A memory device in which lower electrodes, a buffer layer, a seed layer, a magnetic tunnel junction, a capping layer, synthetic antiferromagnetic (SyAF) layers, and an upper electrode are formed on a substrate in a laminated manner, wherein the magnetic tunnel junction comprises free layers consisting of first and second free layers and a separation layer, and a tunneling barrier and a pinned layer, wherein the separation layer is formed between the first and second free layers and is formed of a polycrystalline conductive material.

2. The memory device according to claim 1, further comprising a lower barrier formed between the seed layer and the first free layer.

3. The memory device according to claim 1, wherein the lower barrier is formed of a material identical to that of the tunneling barrier.

4. The memory device according to claim 1, wherein the separation layer is formed of a material which crystallizes at a temperature of 400° C. or higher.

5. The memory device according to claim 4, wherein the separation layer is formed of tungsten.

6. The memory device according to claim 5, wherein the separation layer is formed to have a thickness of 0.4 nm to 0.8 nm.

7. The memory device according to claim 2, wherein the first and second free layers are formed to have identical thicknesses or different thicknesses.

8. The memory device according to claim 4, wherein at least one of the lower electrodes, the seed layer, and the capping layer is formed of a material which crystallizes at a temperature of 400° C. or higher.

9. The memory device according to claim 8, wherein at least one of the lower electrodes, the seed layer, and the capping layer is formed of tungsten.

10. The memory device according to claim 1, wherein the magnetic tunnel junction has a squareness of magnetization change of more than 0.8 and 1 or less after heat treatment at 400° C. or higher.

11. A memory device in which lower electrodes, a buffer layer, a seed layer, a magnetic tunnel junction, a capping layer, synthetic antiferromagnetic (SyAF) layers, and an upper electrode are formed on a substrate in a laminated manner, wherein the magnetic tunnel junction comprises free layers consisting of first and second free layers and a separation layer, and a tunneling barrier and a pinned layer, wherein the separation layer is formed between the first and second free layers; and at least one of the lower electrodes, the seed layer, the separation layer, and the capping layer is formed of a polycrystalline conductive material.

12. The memory device according to claim 11, wherein the polycrystalline conductive material comprises a material which crystallizes at a temperature of 400° C. or higher.

13. The memory device according to claim 12, wherein the polycrystalline conductive material comprises tungsten.

14. A method of fabricating a memory device, comprising:
a step of forming lower electrodes, a buffer layer, a seed layer, a magnetic tunnel junction, a capping layer, synthetic antiferromagnetic (SyAF) layers, and an upper electrode on a substrate in a laminated manner; and
a step of performing heat treatment at 400° C. to 500° C., wherein, when the magnetic tunnel junction is formed, a first free layer, a separation layer, and a second free layer are formed and then a tunneling barrier and a pinned layer are formed, wherein the separation layer is formed of a polycrystalline conductive material; and
the heat treatment is performed after the upper electrode is formed.

* * * * *